(12) United States Patent
Palanduz et al.

(10) Patent No.: US 7,216,406 B2
(45) Date of Patent: May 15, 2007

(54) METHOD FORMING SPLIT THIN FILM CAPACITORS WITH MULTIPLE VOLTAGES

(75) Inventors: Cengiz A. Palanduz, Chandler, AZ (US); Larry E. Mosley, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 182 days.

(21) Appl. No.: 10/954,644

(22) Filed: Sep. 29, 2004

(65) Prior Publication Data

US 2006/0070219 A1    Apr. 6, 2006

(51) Int. Cl.
*H04R 17/00* (2006.01)
*H01G 4/06* (2006.01)

(52) U.S. Cl. ............. 29/25.35; 29/25.41; 29/25.42; 29/830; 29/831; 29/832; 361/321.2; 361/306.1

(58) Field of Classification Search ............ 29/25.35, 29/25.41, 25.42, 830, 831, 832; 324/66, 324/96, 72, 144; 361/321.2, 306.1, 320
See application file for complete search history.

(56) References Cited

U.S. PATENT DOCUMENTS

| | | | | |
|---|---|---|---|---|
| 5,012,153 | A | * | 4/1991 | Atkinson et al. ............ 313/336 |
| 5,150,019 | A | * | 9/1992 | Thomas et al. ............. 315/350 |
| 5,262,388 | A | * | 11/1993 | Munro et al. ................ 504/271 |
| 5,572,042 | A | * | 11/1996 | Thomas et al. ................ 257/10 |
| 5,652,817 | A | * | 7/1997 | Brinkman et al. ............ 385/37 |
| 6,072,690 | A | | 6/2000 | Farooq et al. |
| 6,461,493 | B1 | | 10/2002 | Farooq et al. |
| 6,477,034 | B1 | | 11/2002 | Chakravorty et al. |
| 6,611,419 | B1 | | 8/2003 | Chakravorty |

FOREIGN PATENT DOCUMENTS

WO      WO-2006/039438 A3      7/2006

* cited by examiner

*Primary Examiner*—A. Dexter Tugbang
*Assistant Examiner*—Tai Van Nguyen
(74) *Attorney, Agent, or Firm*—Schwegman, Lundberg, Woessner & Kluth, P.A.

(57) ABSTRACT

A method for forming a split thin film capacitor for providing multiple power and reference supply voltage levels to electrical devices such as integrated circuits, may be useful in space restricted applications, and in applications that require very close electrical connections between the power consumer and the power supply. An example of both a space restricted application and a close coupling application may be an integrated circuit such as a microprocessor, that may need a closely coupled capacitor supplying and moderating power to the microprocessor in order to quickly respond to instantaneous power demands that may be found in high clock rate devices. The method may supply a lower voltage power supply level for minimum sized transistors in the fast core logic portions of the microprocessor, and a higher voltage power supply level for the cache memory and I/O transistors.

15 Claims, 5 Drawing Sheets

METHOD FORMING SPLIT THIN FILM CAPACITORS WITH MULTIPLE VOLTAGES

TECHNICAL FIELD

Various embodiments described herein relate to capacitor design generally, including thin film capacitors used in conjunction with electronic devices such as integrated circuits.

BACKGROUND INFORMATION

Many electronic devices have localized momentary current requirements that can not always be properly supplied by the power supply, resulting in local voltage level shifts and possible erroneous signal propagation. It is known to use capacitors in local power smoothing applications in electrical and electronic devices. However, as the clock cycle rate in electronic devices continues to increase as the devices get smaller, particularly in integrated circuit devices such as microprocessors and memories, the need for closely coupled capacitors increases. In addition, as electronic devices get smaller operating voltages need to be reduced in certain portions of the device to keep the electric fields below a critical level where device reliability decreases. One method of maintaining electronic device performance while reducing operating voltages in critical reliability portions of the device is to operate with two power supplies having different voltage supply levels. For example, the internal logic portion of an integrated circuit (i.e., IC) may use minimum sized transistors in order to obtain the fastest possible operational speeds, and may thus require a low voltage power supply, while the input and output (i.e., I/O) drivers on the periphery of the IC may use larger and more powerful transistors that need a higher voltage power supply and can withstand higher voltage levels than the small logic transistors can tolerate without reliability degradation. As a result of the two power supply voltage situation just discussed, there may exist a need for two different closely coupled capacitors associated with the same integrated circuit chip. Using of two different capacitors with different voltage supply levels may become a space issue in an electronic device, for example inside an IC package, and thus a need exists for a single capacitor having multiple voltage level capabilities. There may also be a need for a capacitor having two separate power supplies to isolate noise.

DETAILED DESCRIPTION

Figure 1:
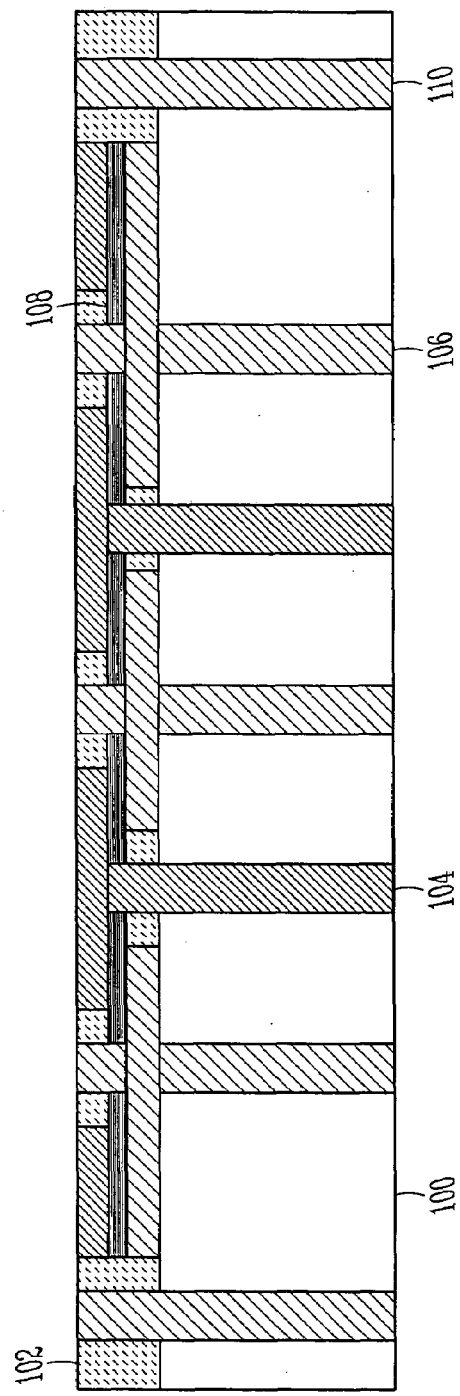
FIG. 1 is a diagram of a side view of an exemplary embodiment of the invention.

In the following detailed description, reference is made to the accompanying figures which form a part thereof, and in which is shown, by way of illustration of the principles of the invention, specific embodiments of ways in which the invention may best be practiced. In the drawings, like numerals describe substantially similar components throughout the various views of the embodiments. These embodiments are described in sufficient detail to enable those skilled in the art to practice the invention. Other embodiments of the principles of this disclosure may be used, and various structural and material changes may be made to the embodiments disclosed herein without departing from the scope and principles of the present invention.

The terms "high" and "low" as used herein for dielectric constants(i.e., high k and low k) are relative terms referring to materials having dielectric constants that are relative to standard dielectric materials such as silicon dioxide and silicon nitride. When the terms "high" and "low" are used herein for voltages, they refer to comparative values in power supply voltage values, and the term "ground" refers to the reference voltage supply. The value of "high" voltages will vary depending upon various factors in the electrical system in which these embodiments may be practiced, such as the technology and size of the integrated circuits found in the electrical system, and other such differences. For example, as ICs become smaller, they become more sensitive to high voltage degradation of gate oxide in MOSFETs and junction punchthrough in bipolar junction transistors, and the operating voltages are often reduced to increase device lifetimes.

Referring now to FIG. 1, a side view of the internal construction of a thin film capacitor is shown having a substrate 100, typically made of either a standard or a low value dielectric material (i.e., low k), having a second dielectric layer 102 on a top surface, typically made of a low k material to reduce signal cross talk in a number of electrical vias and multiple signal lines traversing the substrate in various directions such as straight through from top surface to bottom surface, lateral conductive lines connecting different portions of the device utilizing the top surface, internal surfaces and the bottom surface, and making external electrical contacts to other electrical devices and printed circuit boards (i.e., PCBs). In this illustrative embodiment there are shown in cross section a number of electrical lines and vias 104 forming a top plate of a thin film capacitor (i.e., TFC) and connecting the top plate to the backside of the substrate 100. There are also shown a number of electrical lines and vias 106 which form a bottom plate of the TFC buried in the second dielectric layer 102 and connect the bottom plate to the backside of the substrate 100. The two capacitor plates 104 and 106 are separated by a high dielectric value (i.e., high k) dielectric material 108, to form a high value capacitor. Any high k material may be used as the layer 108. An illustrative example of high k materials includes, barium strontium titanate, barium titanate, or strontium titanate, which may be useful if the dielectric layer 100 is a tape cast ceramic. Numerous other high k dielectric materials are well known to those of skill in the art and may be used in the practice of this embodiment as required by the materials and processes used in the particular application.

The illustrative example shown in FIG. 1 may clearly be extended to include vertical electrically conductive lines such as 110 to connect portions of the top surface to both external electrical devices using contact pads on either the top or bottom surfaces, and to connect portions of the TFC in one location to other locations on the substrate 100. For example, all of the top capacitor electrode plate sections 104 may be connected together to form one large capacitor by the use of horizontal electrical conductors on either the bottom side, the top side, or buried inside the substrate 100, by methods well known to those in the art. The joined top plate electrode lines may then be connected to the vertical conductors 110, and thus to an external power supply via contact pads on the top surface or on the bottom surface. Alternately, the joined top plate electrode lines may connect to the external electrical device by connection pads located on the bottom surface of the substrate 100 without need of the vertical connectors 110. In a similar fashion the buried bottom capacitor plates 106 may be connected together to form one large capacitor plate by similar means to those discussed above, and connected to an external electrical device, such as an IC or power supply, by connections on either the top or bottom surface.

The illustrative example shown in FIG. 1 may be extended to include an arrangement where the structures shown on the top surface of the substrate may be also formed on the bottom surface to provide capacitors having essentially twice the area and capacitance in the same amount of overall used area of the electrical device to which the capacitor may be attached. It is also to be understood that the vertical electrical conductors 110 are not limited to the shown single row around the periphery of the capacitor, but may have multiple rows of vertical connectors and contact pads, and may form an area array of connectors to reduce the resistance and inductance of the outgoing and incoming electrical current. Thus, in the illustrative embodiment shown in FIG. 1, each of the top capacitor plates 104 may be connected to different voltage power supplies by means of the included electrical conductors such as the vertical connections 110, while the lower capacitor plates 106 may be all connected to a reference supply to provide what may be called a ground voltage. Alternatively, the lower capacitor plates 106 may be connected to separate reference voltage supplies in conjunction the separation of the top capacitor plates 104 for a variety of reasons, such as ground bounce isolation. With such an arrangement it is possible to provide an electrical circuit, such as an IC, with two different power supply voltages such as may be useful in supplying a low voltage level to an internal minimum sized transistor logic portion of the IC, while supplying a higher voltage level to a memory cache or to an input/output (i.e., I/O) portion of the same IC.

Figure 2:
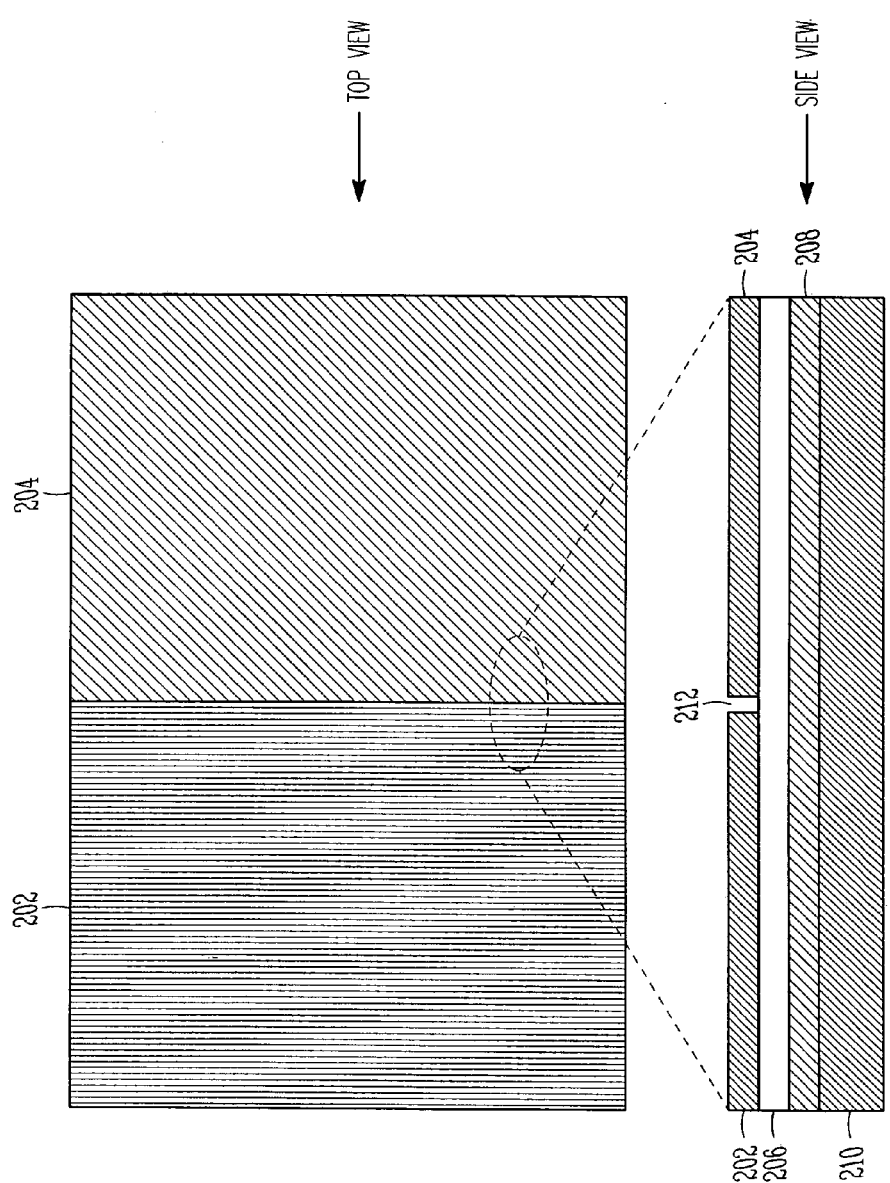
FIG. 2 is a diagram of a top view and a side view of another exemplary embodiment of the invention.

In FIG. 2, a top view of a thin film capacitor (i.e., TFC) having the top capacitor plate divided illustratively into two separate sections is shown in the top portion of the figure. In this illustrative example, the left side 202 of the capacitor is selected to provide an operating voltage level to a memory cache portion of a closely coupled electrical device, such as an IC directly mounted to the top surface of the TFC. The right side 204 of the illustrative TFC is selected to provide a different operating voltage level to a voltage sensitive logic core of the IC. Alternately, the two sides 202 and 204 may individually supply internal IC signals that need to be electrically isolated from one another due to simultaneous switching issues or other design reasons.

In the lower expanded side view portion of FIG. 2, the region around the upper capacitor plate separation is shown. In this illustrative embodiment, the top capacitor plate is shown as being divided into only two sections, and the lower capacitor plate 208 is shown as being a single sheet of electrical conductor. The embodiments described herein are clearly not so limited, as was discussed above with reference to the FIG. 1 illustrative example, where the lower capacitor plate is divided. The capacitor is formed on substrate 210 and has lower capacitor plate 208 covered by a high k dielectric material 206, shown as being continuous in this illustrative example for simplicity. The choice of dielectric material 206 will depend upon the specific application in which the embodiment is to be used. For example, in the low temperature co-fired ceramic art the high k dielectric material may be chosen to be barium strontium titanate or other similar materials. The high k dielectric 206 is shown as being a single continuous layer for simplicity, but the embodiment is not so limited, and the high k dielectric layer may be broken up into as many separate sections as may be most useful to the specific application which is practiced.

Figure 3:
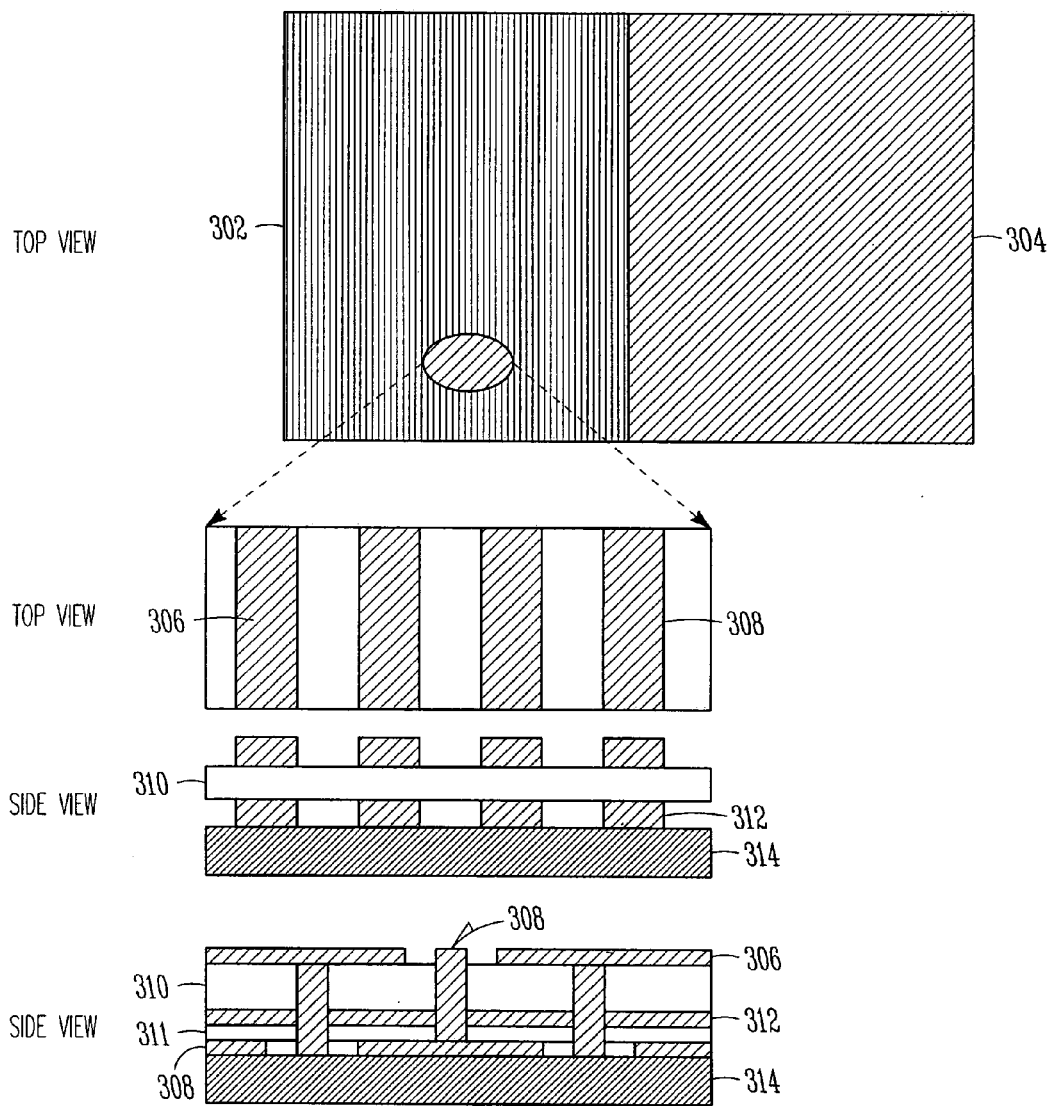
FIG. 3 is a top view and a side view of other exemplary embodiments of the invention.

In FIG. 3, an illustrative embodiment is shown, having a top view with a region 302 selected to provide a lower power supply voltage level to a minimum sized transistor core logic region of an IC, and a region 304 selected to provide a higher, or a lower, or a different power supply voltage level to a memory cache region of the same IC. The region 302 in this illustrative embodiment is seen in the expanded top view to be arranged to provide two different lower voltage power supply values to different regions of the core region of the IC by means of alternating stripes of top capacitor plate conductors, for example the stripes 306 having a connection to a different external power supply as compared to the stripes 308. The different power supplies may have the same voltage level and be separated from one another because of signal isolation issues, or the different power supplies may provide different voltage levels in response to individual region transistor operational differences according to the specific requirements of the application. The same separation of power supplies may also occur in the region 304 selected for use by the cache portion of the IC. For example, the higher voltage supply level region 304 may utilize two different power supply voltage levels for a cache memory section and for an I/O section. The I/O section of the IC in the case of what is known as a BiCMOS process, or other I/O type devices, may use bipolar junction transistors as the output device, and thus may require a different power supply level than the cache MOS transistors.

As seen in the side view of the illustrative embodiment, the separated conductor stripes 306 and 308 of the top capacitor plate 302, sit on a high k dielectric layer 310, shown as being a continuous layer in FIG. 3 for simplicity. The embodiment is not so limited as shown above. The lower conductor forming the lower capacitor plate 312 is shown in this illustrative embodiment as being separated into individual conductor stripes, each one associated with a conductor stripe of the upper capacitor plate 302, but a solid lower capacitor plate attached to a reference voltage supply (e.g., ground) may be the preferred method in many specific applications. The lower capacitor plate conductors 312 are formed on a substrate 314, which may also have through hole conductors, internal level horizontal conductors, and/or another capacitor structure, such that just described, located on the bottom side of the substrate 314, as disclosed previously in conjunction with the description of FIGS. 1 and 2.

With such an arrangement it is possible to provide a cache region of an IC with a higher supply voltage level capacitor 304, while providing two different lower voltage supply levels to portions of an internal core logic region using sections 306 and 308 of the lower power supply voltage capacitor region 302. The total amount of capacitance supplied to the different portions of the lower section 302 may be easily adjusted to the needs of the specific application by means of varying the relative sizes of the stripes 306 versus the size of the stripes 308.

An alternative method of controlling the total amount of capacitance provided to the different portions of either the lower 302 or higher 304 voltage supply regions of the IC is shown at the bottom of FIG. 3 in side view, where an illustrative embodiment having two different high k dielectric layers 310 and 311 is shown. The total amount of capacitance provided to the different portions of the IC may still be controlled by varying the relative areas of conductor stripes 306 and 308 as before, but with this illustrative arrangement the thickness of the two high k dielectric layers may also be varied, as shown in the figure wherein layer 311 is shown as thinner than the other high k dielectric layer 310, or the material used as the high k dielectric may be different for the two layers, or a combination of the two methods may be used as appropriate for the specific application for which the embodiment is practiced.

The stacked capacitor arrangement of the illustrative embodiment shown in FIG. 3, the substrate 314, in addition to the features already discussed, may have the vertical through hole connectors, the internal conductors and the dual sided top and bottom formed capacitor structures as discussed previously with respect to FIGS. 1 and 2 and with respect to the side by side stripe embodiment already discussed.

Figure 4:
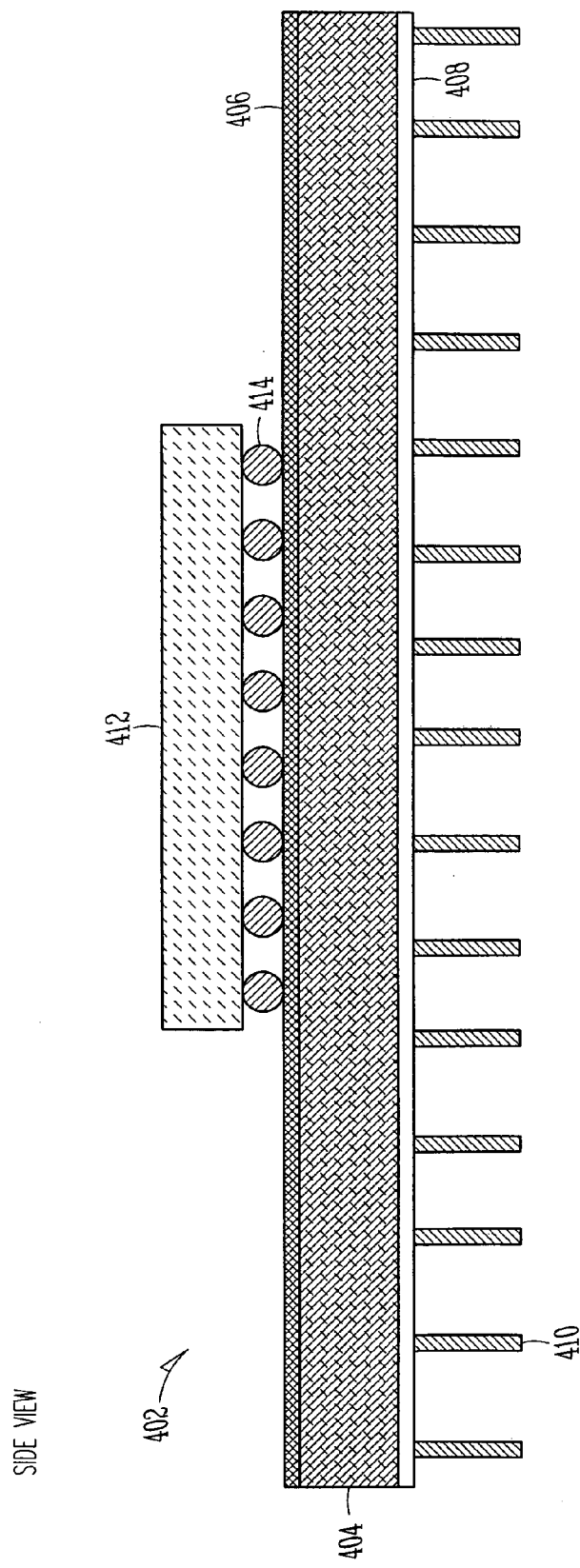
FIG. 4 is a side view of an assembly using an embodiment of the invention.

In FIG. 4, an illustrative embodiment of the TFC in use with a directly mounted IC is shown. The TFC capacitor 402 is shown in an embodiment having an organic substrate 404, which may be a multilayered printed circuit board, having a top side formed capacitor 406, and a bottom side formed capacitor 408. The capacitors may also be embedded in the substrate. The top and bottom capacitors may be connected in various ways, for example they may be totally isolated from one another and serve different portions of the mounted IC 412, or they may be connected to each other to essentially double the amount of available capacitance, or any combination of connections as needed for the specific application to which the TFC is applied.

The bottom surface of the TFC capacitor 402 has a number of connection pads shown to which external contacts maybe connected. For example, the illustrative embodiment shows an area array of pins 410 for connection to a through hole printed circuit board. Alternative connections might include gull wing leads for surface mount applications, ball grid arrays, or socket connector pins such as the full grid socket (i.e., FGS) shown in the figure.

The top surface of the TFC capacitor 402 in this illustrative embodiment has an area array of connection pads arranged to receive and solder a packaged IC 412 using solder ball array 414. Alternative connection methods might include flip chip mounting of a non packaged silicon die using plated solder or gold bumps, or surface mounting a ceramic leaded IC package having an attached heat sink.

With such an arrangement the IC 412 has a short electrical connection to any desired number of different power and reference supply voltage sources from the various portions of the TFC 402. The TFC 402 may also beneficially be used to provide a means of attaching the IC 412 to an electrical device using the electrical connection pins 410. Such an arrangement may have a benefit of allowing the more complete testing of IC 412 prior to assembly in a complete electronic device, due to the proper placement of the necessary capacitance for full speed IC testing.

Figure 5:
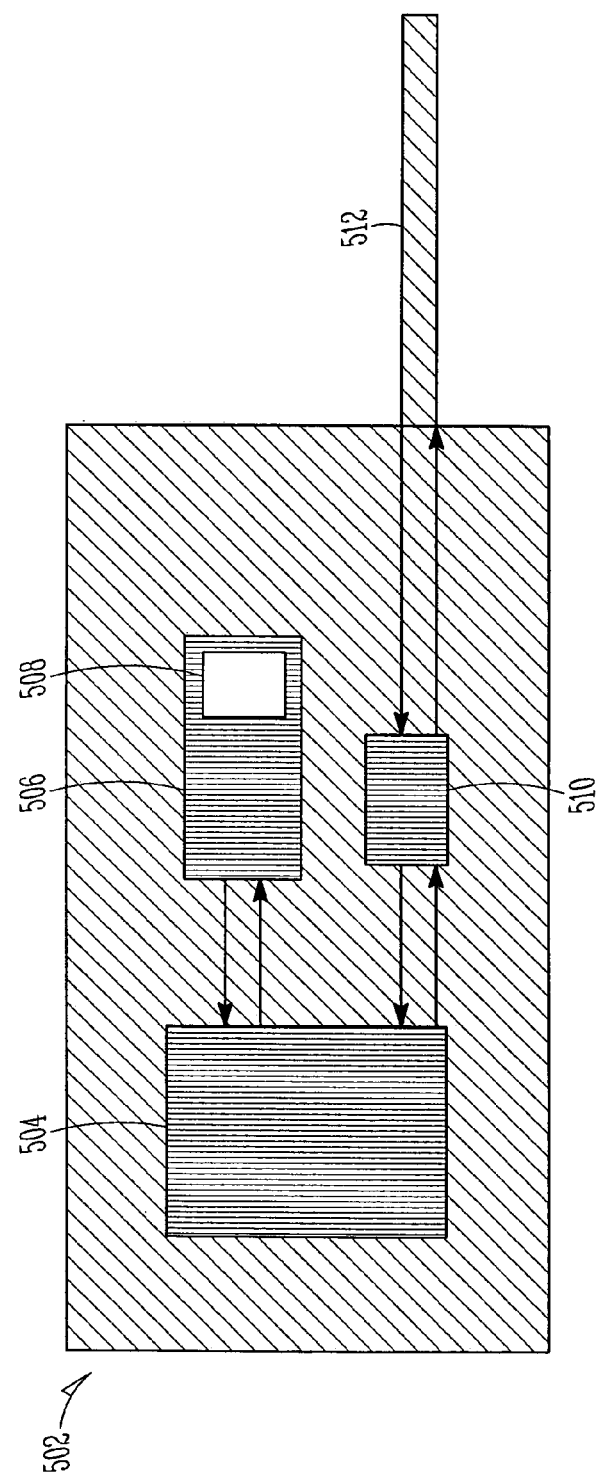
FIG. 5 is a block diagram of a system using an embodiment of the invention.

FIG. 5 is a block diagram of an article of manufacture 502 according to various embodiments, such as a communications network, a computer, a memory system, a magnetic or optical disk, some other information storage device, and/or any type of electronic device or system. The article 502 may comprise a processor 504 coupled to a machine accessible medium such as a memory 506, storing associated information (e.g., computer program instructions 508, and/or other data), and an input/output driver 510 connected to an external electrical device or electronic device by various means, such as bus or cable 512, which when accessed, results in a machine performing such actions as calculating a solution to a mathematical problem. Various ones of the elements of the article 502, for example the processor 504, may have instantaneous current issues that may benefit from use of the present embodiment to help alleviate and moderate the current variations using a closely coupled capacitor. As an illustrative example, the processor 504 may be beneficially packaged in a ceramic package directly on top of a TFC such as that discussed and shown previously in FIG. 4. The embodiment may be applied to any of the component parts of the article 502 as well as to the processor 504.

As another illustrative example, the article 502 may be a system such as a communication network element attached to other network elements (not shown for clarity) via a bus cable 512. The communications network may include a number of coupled network elements interconnected by a bus, such as shown as cable 512 in the figure. The network elements may include including a dipole antenna, unidirectional antenna, or other form of wireless interconnection capability in place of, or in conjunction with the wired cable 512. Among the various elements found in an illustrative communications network, there may be an electronic circuit that may benefit from use of the illustrative embodiments of the TFC described above. The electronic circuit or circuits in the communication network that may benefit from the described closely coupled TFC may include the local microprocessors 504, and the external line drivers such as the input/output driver 510 shown in the figure to send signals down the cable 512. The embodiment may be beneficial to any of the individual components of the shown system depending upon the specific application or use of the system.

As another illustrative example, the article 502 may alternatively be a computer system, having a number of elements including calculating elements 504 such as a microprocessor, memory elements 506 storing program code 508, communication elements and input/output driver elements 510, and may be connected to other computer systems via a bus or cable 512, or by a wireless connection (not shown). One or more of these elements may benefit from use of the described TFC, in particular the I/O driver 510, and/or the calculating element 504, both of which may have instantaneous current issues that a closely coupled TFC may improve. The embodiment may be beneficial to any of the individual components of the system depending upon the use. The embodiment may also be useful with more than one, or any number of the described capacitors used in each described element, which may also include such elements as charge pumps, filters, radio frequency applications, and differential AC couplers, among numerous other examples of the use of capacitors.

The accompanying figures that form a part hereof, show by way of illustration, and not of limitation, specific embodiments in which the subject matter of the disclosure may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of the various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope of meaning of the claims. In addition, in the foregoing Detailed Description, it may be seen that various features are grouped together in a single embodiment for the purpose of streamlining this disclosure and increasing its clarity. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method, comprising:
   electrically separating a first conductive electrode from a second conductive electrode with a dielectric material having a dielectric constant greater than 1.0, in contact with substantially the entirety of at least one surface of the first and second conductive electrodes and forming a capacitor having a first capacitance density;
   electrically separating a first portion of the first conductive electrode from a second portion of the first conductive electrode with the dielectric material; and
   providing the first portion of the first conductive electrode with a first voltage, providing the second conductive electrode with a second voltage, and providing the second portion of the first conductive electrode with a third voltage.

2. The method of claim 1, wherein the dielectric material has a dielectric constant higher than a dielectric constant of silicon nitride, and comprises one or more materials selected from the group consisting essentially of barium strontium titanate, barium titanate, strontium titanate and mixtures thereof.

3. The method of claim 1, wherein the first voltage is provided by a first power supply for a cache portion of an integrated circuit, the second voltage is provided by a reference supply, and the third voltage is provided by a power supply other than the one supplying the first voltage, for a core logic portion of the integrated circuit.

4. The method of claim 1, further disposing the second electrode upon a substantially flat substrate of material one or more of which is selected from the group consisting essentially of single crystal silicon, polycrystalline silicon, glass, single crystal oxide, semiconductor material, metal foil, tape cast ceramic, polymer and mixtures thereof.

5. The method of claim 4, wherein the substrate material has a plurality of conductive vias disposed to conduct electrical signals from a top side of the substrate to a bottom side of the substrate.

6. The method of claim 5, wherein the plurality of conductive vias comprises:

a first plurality of vias electrically connecting the first portion of the first conductive electrode to a first portion of the bottom side of the substrate;
   a second plurality of vias electrically connecting the second conductive electrode to a second portion of the bottom side of the substrate;
   a third plurality of vias electrically connecting the second portion of the first conductive electrode to a third portion of the bottom side of the substrate; and
   a fourth plurality of vias electrically connecting a fourth plurality of contact locations on the top side of the substrate to a fifth plurality of contact locations on the bottom side of the substrate, wherein selected ones of the pluralities of vias are disposed to electrically connect to a selected one of a plurality of flip chip mounting bumps on an integrated circuit.

7. The method of claim 4, further comprising a third conductive electrode disposed upon the bottom side of the substrate, separated by a dielectric material having a second dielectric constant from a fourth conductive electrode.

8. The method of claim 7, wherein the second dielectric constant is the same as the first dielectric constant, and the fourth electrode is electrically separated in at least two portions.

9. The method of claim 1, further electrically separating the second conductive electrode into at least two portions, and supplying each portion with a separate power supply.

10. The method of claim 9, wherein each electrically separate portion of the second electrode is disposed under an associated electrically separate portion of the first electrode.

11. A method, comprising:
    electrically separating a first conductive electrode from a second conductive electrode with a dielectric material having a dielectric constant;
    electrically separating a first portion of the first conductive electrode from a second portion of the first conductive electrode; and
    providing the first portion of the first conductive electrode with a first voltage, providing the second conductive electrode with a second voltage, and providing the second portion of the first conductive electrode with a third voltage;
    wherein the dielectric material has a dielectric constant higher than a dielectric constant of silicon nitride, and comprises one or more materials selected from the group consisting essentially of barium strontium titanate, barium titanate, strontium titanate and mixtures thereof.

12. A method, comprising:
    electrically separating a first conductive electrode from a second conductive electrode with a dielectric material having a dielectric constant;
    electrically separating a first portion of the first conductive electrode from a second portion of the first conductive electrode;
    providing the first portion of the first conductive electrode with a first voltage, providing the second conductive electrode with a second voltage, and providing the second portion of the first conductive electrode with a third voltage;
    disposing the second electrode upon a substantially flat substrate of material one or more of which is selected from the group consisting essentially of single crystal silicon, polycrystalline silicon, glass, single crystal oxide, semiconductor material, metal foil, tape cast ceramic, polymer and mixtures thereof; and the substrate material has a plurality of conductive vias disposed to conduct electrical signals from a top side of the substrate to a bottom side of the substrate.

13. The method of claim 12, wherein the plurality of conductive vias comprises:
   a first plurality of vias electrically connecting the first portion of the first conductive electrode to a first portion of the bottom side of the substrate;
   a second plurality of vias electrically connecting the second conductive electrode to a second portion of the bottom side of the substrate;
   a third plurality of vias electrically connecting the second portion of the first conductive electrode to a third portion of the bottom side of the substrate; and
   a fourth plurality of vias electrically connecting a fourth plurality of contact locations on the top side of the substrate to a fifth plurality of contact locations on the bottom side of the substrate, wherein selected ones of the pluralities of vias are disposed to electrically connect to a selected one of a plurality of flip chip mounting bumps on an integrated circuit.

14. A method, comprising:
   electrically separating a first conductive electrode from a second conductive electrode with a dielectric material having a dielectric constant;
   electrically separating a first portion of the first conductive electrode from a second portion of the first conductive electrode;
   providing the first portion of the first conductive electrode with a first voltage, providing the second conductive electrode with a second voltage, and providing the second portion of the first conductive electrode with a third voltage;
   disposing the second electrode upon a substantially flat substrate of material one or more of which is selected from the group consisting essentially of single crystal silicon, polycrystalline silicon, glass, single crystal oxide, semiconductor material, metal foil, tape cast ceramic, polymer and mixtures thereof; and
   a third conductive electrode disposed upon the bottom side of the substrate, separated by a dielectric material having a second dielectric constant from a fourth conductive electrode.

15. The method of claim 14, wherein the second dielectric constant is the same as the first dielectric constant, and the fourth electrode is electrically separated in at least two portions.

* * * * *